United States Patent [19]
Furumura et al.

[11] Patent Number: 5,763,005
[45] Date of Patent: Jun. 9, 1998

[54] METHOD FOR FORMING MULTILAYER INSULATING FILM OF SEMICONDUCTOR DEVICE

[75] Inventors: Yuji Furumura; Masahiko Doki; Hidetoshi Nishio, all of Kawasaki, Japan

[73] Assignee: Fujitsu Limited, Kawasaki, Japan

[21] Appl. No.: 589,470

[22] Filed: Jan. 22, 1996

Related U.S. Application Data

[62] Division of Ser. No. 327,820, Oct. 17, 1994, Pat. No. 5,506,443, which is a continuation of Ser. No. 109,517, Aug. 20, 1993, abandoned.

[30] Foreign Application Priority Data

Aug. 26, 1992 [JP] Japan ..................... 4-227265

[51] Int. Cl.[6] .................... C23C 16/00; H01L 21/223
[52] U.S. Cl. .................... 427/248.1; 427/255.4; 427/255.7; 427/344; 427/402; 427/578; 427/579; 438/783; 438/624
[58] Field of Search ............... 427/248.1, 255.7, 427/255.4, 402, 579, 344, 578; 437/238, 240, 235; 438/783, 624

[56] References Cited

U.S. PATENT DOCUMENTS

| | | | |
|---|---|---|---|
| 4,161,743 | 7/1979 | Yonezawa et al. | 257/77 |
| 5,506,443 | 4/1996 | Furumura et al. | 257/635 |

FOREIGN PATENT DOCUMENTS

| | | |
|---|---|---|
| 62-60242 | 9/1985 | Japan . |
| 4-164330 | 6/1992 | Japan . |

Primary Examiner—Roy V. King
Attorney, Agent, or Firm—Staas & Halsey

[57] ABSTRACT

For a multilayer insulating film of a semiconductor device, the distributed quantity of carbon or fluorine is maximized at the interface between insulating films. The concentration of carbon present at the interface is $1 \times 10^{20}$ atoms/cm$^3$ or more.

8 Claims, 5 Drawing Sheets

METHOD FOR FORMING MULTILAYER INSULATING FILM OF SEMICONDUCTOR DEVICE

This application is a division of application Ser. No. 08/327,820 filed Oct. 17, 1994, now U.S. Pat. No. 5,506,443, which is a continuation of application Ser. No. 08/109,517, filed Aug. 20, 1993, now abandoned.

BACKGROUND OF THE INVENTION

1. Field of the Invention

The present invention relates to a multilayer insulating film of a semiconductor device deposited with insulating films such as an interlayer film and cover film and to a method for forming the film.

2. Description of the Related Art

A semiconductor device uses a structure in which a semiconductor active element or aluminum interconnection is covered with an insulating film or the semiconductor circuit is entirely protected with the insulating film.

For example, there are some multilayer interconnection structures in which aluminum interconnection is covered with a silicon oxide film, an SOG film is deposited on the silicon oxide film to smooth the surface, a PSG film is deposited on the SOG film, and aluminum interconnection is formed on the PSG film and covered with a silicon nitride film.

However, when a semiconductor circuit chip is wire-bonded with leads and then they are covered with a resin package into a finished product to apply a high-temperature humidification test to the finished product, insulating films such as a PSG film and an SiN film of the semiconductor circuit may peel off each other at the probability of approx. 1/10,000.

It is estimated that the above phenomenon depends on an insulating material serving as a substrate, leaving time of an insulating film in the atmosphere, treatment method for deposition of the film, change of stress due to hygroscopicity of the film, or design pattern.

However, peeling of the insulating film under the high-temperature humidification test rarely occurs. Also, it rarely occurs in actual products. Therefore, the cause of the phenomenon is not clarified. However, if peeling of the insulating film should occur, there is a problem that the reliability is lost.

SUMMARY OF THE INVENTION

It is an object of the present invention to provide a multilayer insulating film of a semiconductor device with a large adhesive strength between insulating films and a high reliability and a method for forming the film.

As the result of making the peak of carbon or fluorine concentration present at the interface between insulating films according to the present invention, it is experimentally confirmed that peeling of insulating films from each other hardly occurs compared with the case in which no peak of concentration is present at the interface. It is also confirmed that peeling of insulating films from each other easily occurs unless the peak of concentration is present at the interface between insulating films compared with the case in which the peak is present even if the content of carbon or fluorine is rich.

Moreover, it is clarified that the peak of carbon concentration requires $1 \times 10^{20}$ atoms/cm$^3$ or more.

To obtain the peak of concentration of the elements, there are methods for introducing a gas containing the element at the end of deposition of a upper insulating film and for introducing the gas immediately before a lower insulating film is formed. When using a gas containing the element to form insulating films, it is necessary to increase the quantity of the gas to be supplied at the end of deposition of the bottom insulating film or temporarily increase the quantity of the gas to be supplied immediately before forming the upper insulating film.

DESCRIPTION OF THE PREFERRED EMBODIMENTS (First embodiment)

Many samples are required to examine the possibility of peeling of insulating films of a multilayer structure.

Therefore, the step for forming the samples is first described and then, the results of examining the samples are explained below.

Figure 1A:
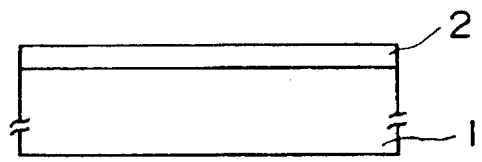
FIGS. 1(a) to 1(d) are sectional views of the step for depositing the insulating films of the first embodiment of the present invention.
Figure 1B:
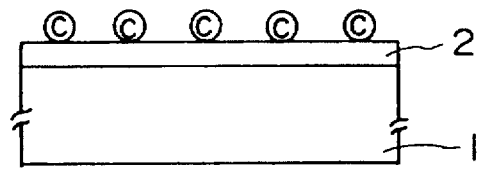

First, as shown in FIG. 1(a), a silicon oxide ($SiO_2$) film 2 is deposited on a semiconductor wafer 1 using plasma CVD.

In an actual semiconductor device fabrication step, interconnection is formed on the $SiO_2$ film 2 after the above sample forming step. However, the description of the interconnection forming step is omitted in this specification.

Figure 3:
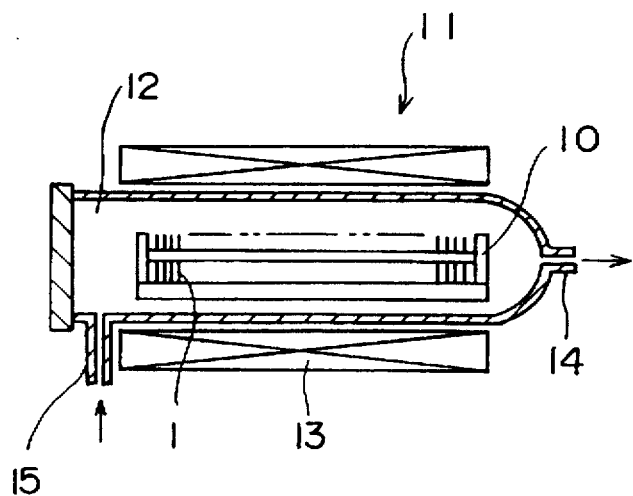
FIG. 3 is a schematic sectional view of one of the insulating film deposition apparatuses used for the present invention.

Then, the step for depositing a PSG (phosphosilicate glass) film on the $SiO_2$ film using thermal CVD is started. In this case, the thermal CVD system 11 shown in FIG. 3 is used. A plurality of semiconductor wafers 1 are first put in a basket 10 and then the basket 10 is put in a reaction chamber 12 of the low-pressure CVD system 11. The reaction chamber 12 is heated up to approx. 400° C. by a heater 13.

Then, gas in the reaction chamber 12 is exhausted from an exhaust port 14 so as to reduce the pressure in the chamber before introducing $C_2F_6$ gas into the reaction chamber 12 through a gas introduction port 15 to supply the gas to the surface of an $SiO_2$ film 2. Thus, the surface of the $SiO_2$ film 2 is doped with carbon (C).

Figure 1C:
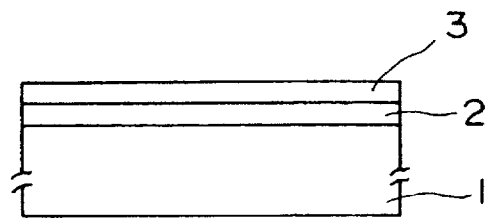

Then, introduction of $C_2F_6$ gas is stopped to purge the gas from the reaction chamber 12 before introducing the mixed gas of $SiH_4$, $O_2$, and $PH_3$ into the reaction chamber 12. Thus, as shown in FIG. 1(c), a PSG film 3 with the thickness of 0.75 μm is chemical-vapor-deposited on the $SiO_2$ film 2. Thereafter, the semiconductor wafers 1 are taken out of the reaction chamber 12.

Figure 1D:
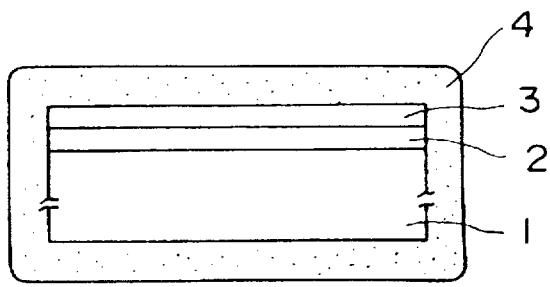

Then, as shown in FIG. 1(d), each semiconductor wafer 1 is divided into a plurality of chips before sealing each chip with a package 4 made of epoxy-based resin. Thus, a sample is completed.

Then, the state of peeling of the PSG film 3 from the $SiO_2$ film 2 is examined by using the sample. However, because peeling rarely occurs, a plurality of samples formed under the same condition are prepared. Moreover, because the state of peeling may depend on the quantity of carbon stuck on the surface of the $SiO_2$ film 2, a plurality of samples with different quantities of stuck carbon are prepared by changing the flow rate of $C_2F_6$ gas or the introduction time of the gas.

Figure 2:
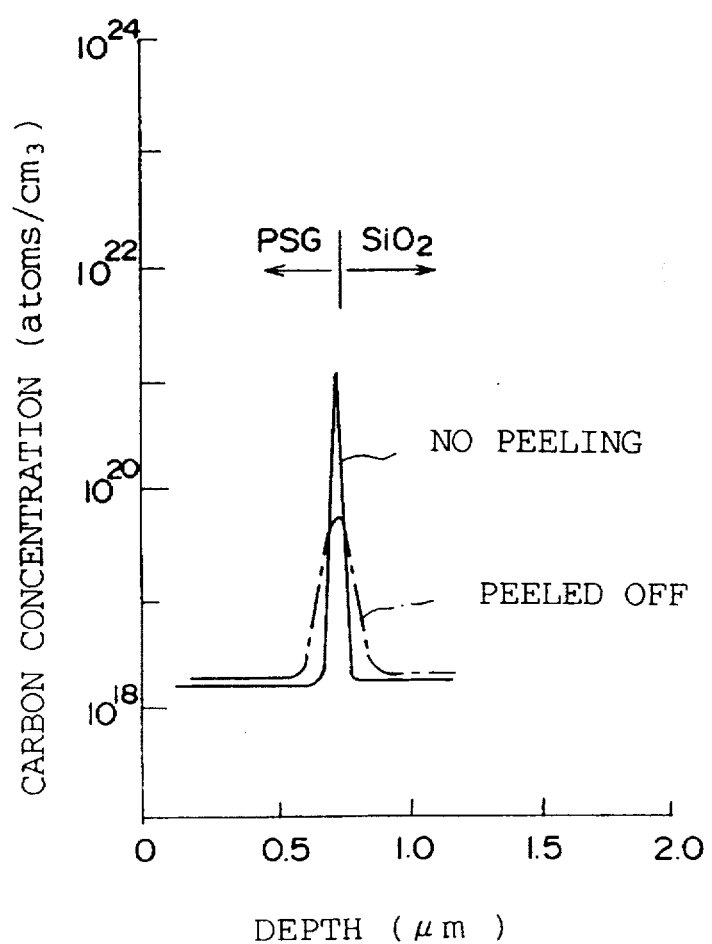
FIG. 2 is a chart showing carbon concentration distribution of the multilayer insulating film of the first embodiment of the present invention.

Then, as the result of applying the pressure cooker test to the samples under the conditions of the temperature of 121° C., pressure of 2 atm. and relative humidity of 100% and analyzing them using the secondary ion mass spectrometry (SIMS), the results shown in FIG. 2 are obtained. From FIG. 2, it is found that peeling of the PSG film 3 from the $SiO_2$ film does not occur at all when the carbon concentration at the interface between the $SiO_2$ films 2 and PSG film 3 comes to show $1\times10^{20}$ atoms/cm$^3$ or more and peeling occurs at the probability of approx. 1/10,000 when the carbon concentration comes to show less than the above value. And, the peeling is difficult to occur when the peak of carbon is present at the interface between the $SiO_2$ film 2 and PSG film 3.

The inventor of the present invention understands that this is because carbon coheres with other elements to produce a molecule such as Si—C—Si, O—C—O, or O—C—Si with a large cohesive strength and, when the carbon concentration comes to show $1\times10^{20}$ atoms/cm$^3$ or more, the adhesive strength at the interface between the $SiO_2$ films 2 and PSG film 3 increases.

Though ion implantation is considered as a method for supplying carbon to the interface between insulating films, it is considerably difficult to set the peak at the interface between insulating films.

In FIG. 2, the carbon contained in the $SiO_2$ films 2 and PSG film 3 is due to the fact that the gas discharged from the inner wall or the like of the reaction chamber 12 is mixed in.

$CF_4$ or $CH_4$ can be used as the gas for supplying carbon to the surface of the $SiO_2$ films 2 instead of $C_2F_6$ so as to obtain a similar result.

(Second embodiment)

In this embodiment, it is explained to give the peak of a fluorine distribution to the interface between insulating films.

Figure 4:
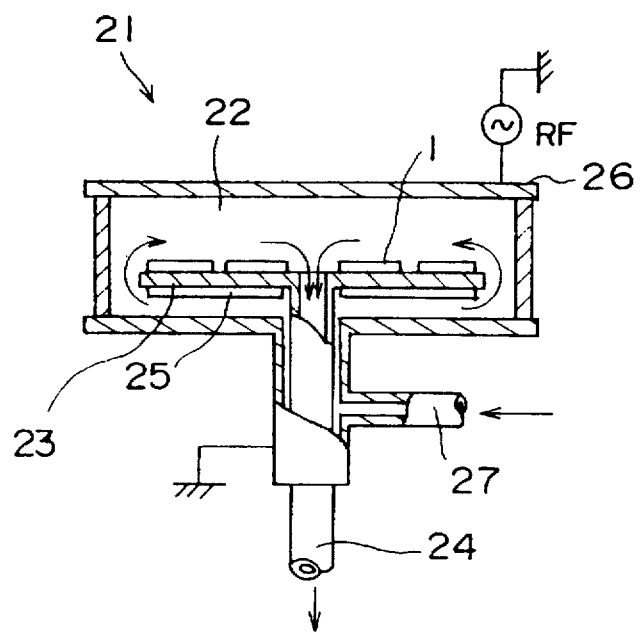
FIG. 4 is a schematic sectional view of the other of the insulating film deposition apparatuses used for the present invention.

First, as shown in FIG. 4, a semiconductor wafer 1 is put on a susceptor 23 in a reaction chamber 22 of a plasma CVD system 21 and gas is exhausted from an exhaust portion 24 so as to reduce the pressure in the reaction chamber 22. The semiconductor wafer 1 is heated up to 400° C. by a heater 25 and moreover, a radio-frequency power supply RF of 13.5 Mhz is connected to an electrode 26. The output of the radio-frequency power supply RF is set to 300 W.

Figure 5A:
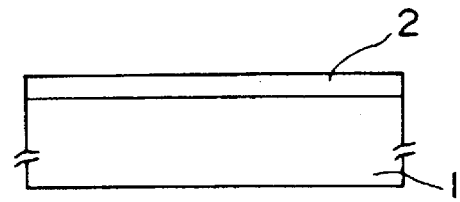
FIGS. 5(a) to 5(d) are sectional views of the step for depositing the insulating films of the second embodiment of the present invention.
Figure 5B:
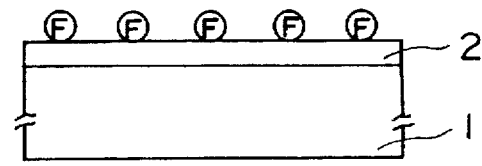

Then, $SiH_4$ and $N_2O$ are introduced through a gas introduction port 27 to deposit the $SiO_2$ films 2 on the semiconductor wafer 1 as shown in FIG. 5(a). In this case, a fluorine-based gas such as $CF_4$, $C_2F_6$, $NF_3$ or $BF_3$ is introduced to make it stick to the surface of the $SiO_2$ films 2 or permeate the film 2 around or immediately after the end of film deposition as shown in FIG. 5(b).

Figure 5C:
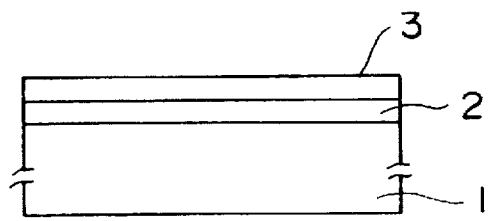

Then, the semiconductor wafer 1 is taken out before depositing the PSG film 3 on the $SiO_2$ films 2 using low-pressure CVD as shown in FIG. 5(c) similar to the case of the first embodiment.

Figure 5D:
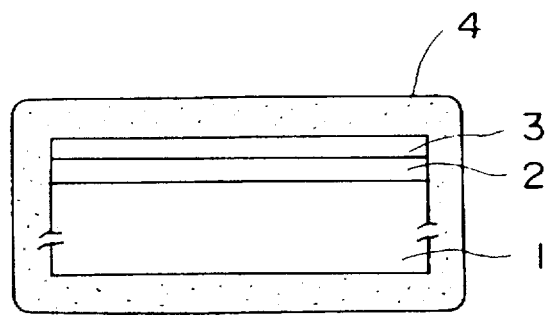

Then, the semiconductor wafer 1 is divided into a plurality of chips. Each chip is sealed in the package 4 made of epoxy-based resin shown in FIG. 5(d) to use it as a sample.

Many samples are prepared similar to the case of the first embodiment.

Moreover, many samples with different contents of fluorine present at the interface between the $SiO_2$ films 2 and PSG film 3 and many samples containing fluorine in the $SiO_2$ films 2 are prepared.

Figure 6:
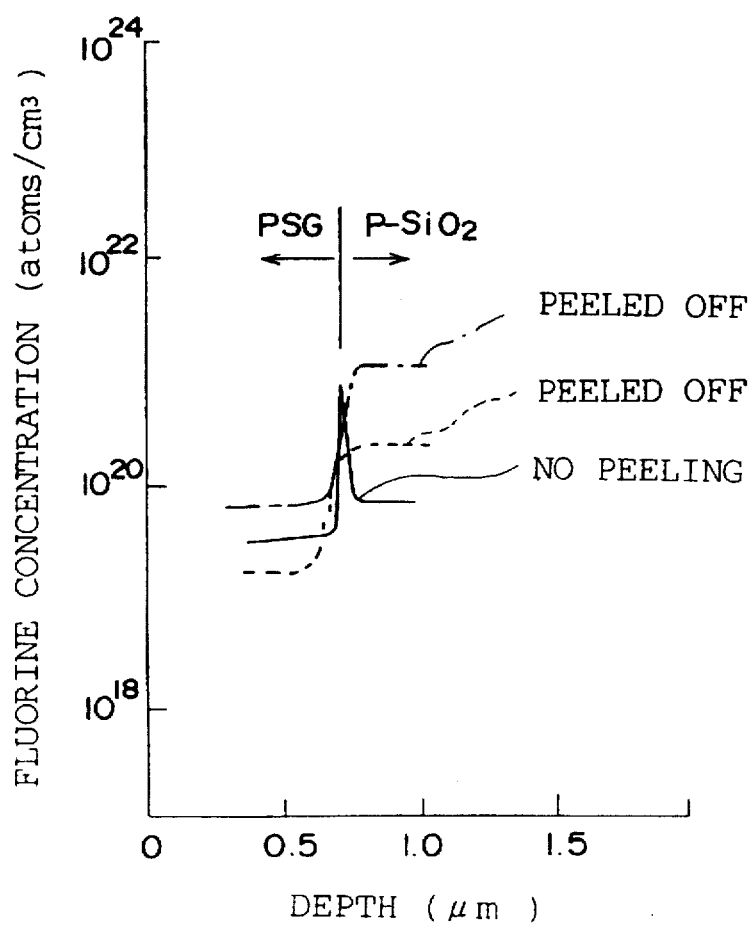
FIG. 6 is a chart showing the fluorine distribution concentration of the multilayer insulating film of the second embodiment of the present invention.

Then, as the result of testing the state of peeling of the $SiO_2$ films 2 from the PSG film 3, it is found that no peeling occurs only when the peak of fluorine is present at the interface between the films as shown by a continuous line in FIG. 6.

And it is clarified that peeling rarely occurs unless the peak is present at the interface between deposited insulating films even if a lot of fluorine is present at the interface between the $SiO_2$ films 2 and PSG film 3 as shown by a broken line and an alternate long and short dash line in FIG. 5. Even if a lot of fluorine is contained in the insulating films, the same effect is obtained if a slight fluorine peak is present at the interface.

Moreover, from an experiment, a similar result is obtained even if the peak of the profile of fluorine quantity at the interface between insulating films is $1\times10^{17}$ atoms/cm$^3$ or more.

Fluorine may be slightly contained in the $SiO_2$ films 2 and PSG film 3 because the gas discharged from the inner wall or the like of the reaction chamber 12 is mixed in.

It is possible to supply a fluorine-based gas to the $SiO_2$ films 2 immediately after deposition of the $SiO_2$ films 2 or immediately before deposition of the PSG film 3 by a low-pressure CVD system.

(Other embodiments)

In the above two embodiments, it is separately explained to set the peak of carbon at the interface between the $SiO_2$ films 2 and PSG film 3 and to set the peak of fluorine at the interface.

However, it is also possible to make these peaks coexistent at the interface to increase the adhesive strength between insulating films.

In the above embodiments, it is explained to increase the adhesive strength between the $SiO_2$ films 2 an PSG film 3. However, it is also possible to use insulating films made of materials other than the above films.

For example, the adhesive strength between films also increases by giving the peak of fluorine to the interface between insulating films made of different materials such as $SiO_2$, $SiO_xN_{1-x}(x<1)$, $SiN_x(x<1)$, SOG (spin on glass), and BPSG (boro-phospho-silicate glass) or made of the same material or giving carbon having the peak of a concentration distribution at the concentration of $1\times10^{20}$ atoms/cm$^3$ or more to the interface between the insulating films.

As an example of deposition conditions of various types of insulating films, the following table shows types of carbon-based and fluorine-base gases for doping the interface between the insulating films.

TABLE

| Insulating film | ECR-CVD SiO$_2$ | Thermal-CVD SiO$_2$ | Plasma-CVD SiON |
|---|---|---|---|
| RF (13.5 MHz) | 700 W | — | 300 W |
| Microwave | 300 W | — | — |
| Deposition gas | SiH$_4$ + O$_2$ | SiH$_4$ + N$_2$O | SiH$_4$ + NH$_3$ + N$_2$O |
| Temperature | 200° C. | 400° C. | 400° C. |
| Doping gas | NF$_3$, C$_2$F$_6$, CF$_4$, BF$_3$, CH$_4$ | | |

What is claimed is:

1. A method for forming a multilayer insulating film of a semiconductor device, comprising the steps of:

forming a first Si-containing insulating film;

supplying a carbon-containing gas to the surface of the first insulating film to dope carbon into the surface; and depositing a second Si-containing insulating film on the first insulating film, such that a peak carbon concentration exists at an interface between the first and second insulating films.

2. A method for forming a multilayer insulating film of a semiconductor device according to claim 1, wherein the carbon is distributed at the concentration of 1×10$^{20}$ atoms/cm$^3$ or more at the interface between the first and second insulating films.

3. A method for forming a multilayer insulating film of a semiconductor device according to claim 1, wherein the carbon-containing gas is selected from the group consisting of CF$_4$, C$_2$F$_6$, and CH$_4$.

4. A method for forming a multilayer insulating film of a semiconductor device according to claim 1, wherein a carbon-containing gas is supplied in forming the first or second insulating film, and the quantity of carbon-containing gas supplied in forming the first or second insulating film is smaller than that of the carbon-containing gas supplied to the surface of the first insulating film.

5. A method for forming a multilayer insulating film of a semiconductor device, comprising the steps of:

forming a first Si-containing insulating film;

supplying a fluorine-containing gas to the surface of the first insulating film to dope fluorine into the surface; and depositing a second Si-containing insulating film on the first insulating film, such that a peak fluorine concentration exists at an interface between the first and second insulating films.

6. A method for forming a multilayer insulating film of a semiconductor device according to claim 5, wherein the fluorine is distributed at the concentration of 1×10$^{17}$ atoms/cm$^3$ or more at the interface between the first and second insulating films.

7. A method for forming a multilayer insulating film of a semiconductor device according to claim 5, wherein the fluorine-containing gas is selected from the group consisting of CF$_4$, C$_2$F$_6$, NF$_3$ and BF$_3$.

8. A method for forming a multilayer insulating film of a semiconductor device according to claim 5, wherein a fluorine-containing gas is supplied in forming the first or second insulating film, and the quantity of the fluorine-containing gas supplied in forming the first or second insulating film is smaller than that of the fluorine-containing gas supplied to the surface of the first insulating film.

* * * * *